(12) United States Patent
Lee et al.

(10) Patent No.: US 8,222,631 B2
(45) Date of Patent: Jul. 17, 2012

(54) ORGANIC THIN FILM TRANSISTOR AND FLAT DISPLAY DEVICE HAVING THE SAME

(75) Inventors: Hun-Jung Lee, Suwon-si (KR); Taek Ahn, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 201 days.

(21) Appl. No.: 11/508,147

(22) Filed: Aug. 23, 2006

(65) Prior Publication Data

US 2007/0131926 A1 Jun. 14, 2007

(30) Foreign Application Priority Data

Dec. 9, 2005 (KR) .................. 10-2005-0120916

(51) Int. Cl.
*H01L 29/08* (2006.01)
*H01L 35/24* (2006.01)
*H01L 51/00* (2006.01)

(52) U.S. Cl. .............. 257/40; 257/66; 257/741; 257/59; 257/72

(58) Field of Classification Search .............. 257/40, 257/59, 66, 72, 741
See application file for complete search history.

(56) References Cited

U.S. PATENT DOCUMENTS

| | | | |
|---|---|---|---|
| 6,917,403 B2 | 7/2005 | Hashimoto et al. | |
| 2004/0012017 A1* | 1/2004 | Nagayama | 257/40 |
| 2004/0232443 A1* | 11/2004 | Cho et al. | 257/202 |
| 2004/0256979 A1* | 12/2004 | Murakami et al. | 313/503 |
| 2005/0009248 A1 | 1/2005 | Weng et al. | |
| 2005/0012094 A1 | 1/2005 | Park | |
| 2005/0279999 A1* | 12/2005 | Lee et al. | 257/66 |
| 2006/0033109 A1* | 2/2006 | Park | 257/59 |
| 2006/0060855 A1* | 3/2006 | Lee et al. | 257/59 |
| 2006/0066224 A1* | 3/2006 | Ito | 313/504 |
| 2006/0091785 A1* | 5/2006 | Lee et al. | 313/498 |
| 2006/0108581 A1* | 5/2006 | Ahn et al. | 257/40 |
| 2006/0119251 A1* | 6/2006 | Kim | 313/500 |
| 2007/0012922 A1* | 1/2007 | Harada et al. | 257/66 |
| 2007/0026585 A1* | 2/2007 | Wong et al. | 438/151 |
| 2008/0121873 A1* | 5/2008 | Katakura et al. | 257/40 |

FOREIGN PATENT DOCUMENTS

| | | |
|---|---|---|
| CN | 1371017 | 2/2002 |
| CN | 1463381 | 12/2003 |
| CN | 1628492 | 6/2005 |
| JP | 2004-103905 | 4/2004 |
| JP | 2005-340771 | 12/2005 |
| KR | 2006-106061 | 10/2006 |

OTHER PUBLICATIONS

Office Action issued in Korean Patent Application No. 2005-120916 on Nov. 15, 2006.
Office Action issued by the State Intellectual Property Office of China in Chinese Patent Application No. 2006101595240 on Sep. 11, 2009.
Japanese Office Action dated Mar. 9, 2010, issued in corresponding Japanese Patent Application No. 2006-221262.

* cited by examiner

*Primary Examiner* — Telly Green
(74) *Attorney, Agent, or Firm* — H.C. Park & Associates, PLC (57) ABSTRACT

An organic thin film transistor in which source and drain electrodes have a double layer structure to aid patterning of an organic semiconductor layer using a laser beam, and a flat display device having the organic thin film transistor. The organic thin film transistor includes: a gate electrode; a source electrode and a drain electrode insulated from the gate electrode; an organic semiconductor layer insulated from the gate electrode and having a portion patterned to electrically connect to the source and drain electrodes; and a protection layer formed on the source and drain electrodes.

9 Claims, 5 Drawing Sheets

ORGANIC THIN FILM TRANSISTOR AND FLAT DISPLAY DEVICE HAVING THE SAME

CROSS-REFERENCE TO RELATED APPLICATIONS

This application claims the benefit of Korean Patent Application No. 2005-120916, filed Dec. 9, 2005, in the Korean Intellectual Property Office, the disclosure of which is incorporated herein by reference.

BACKGROUND OF THE INVENTION

1. Field of the Invention

Aspects of the present invention relate to an organic thin film transistor, and a flat display device having the organic thin film transistor, and more particularly, to an organic thin film transistor in which a source electrode and a drain electrode are formed in a double layer structure to aid the patterning of an organic semiconductor layer using a laser beam, and a flat display device having the same.

2. Description of the Related Art

Thin film transistors (TFTs) are used in flat display devices, such as, for example, liquid crystal display (LCD) devices, organic light emitting display (OLED) devices, and inorganic light emitting display devices. The TFTs are used as switching devices to control an operation of each pixel and as driving devices to drive each pixel.

Typical TFTs include source/drain regions doped with a high concentration of a dopant and an organic semiconductor layer having a channel region formed between the source and drain regions, a gate electrode located on a region corresponding to the channel region and insulated from the semiconductor layer, and source and drain electrodes which respectively contact the source/drain regions.

TFTs are in demand not only for display devices but also in various other fields, such as smart cards, E-paper, roll-up displays, etc. A common aspect required by these thin electronic devices is flexibility. For this reason, the substrate that forms the TFTs must have flexibility, like a plastic substrate.

Figure 1:
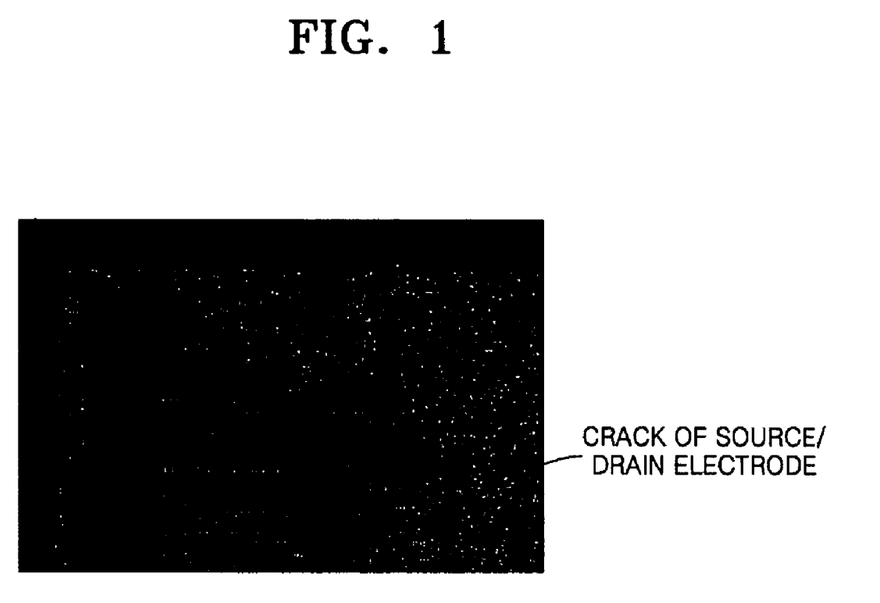
FIG. 1 is photograph showing cracks in source and drain electrodes when patterning an organic semiconductor layer by irradiating a laser in an organic thin film transistor.

During manufacturing of organic TFTs, source and drain electrodes are formed of a noble metal such as Au, Pt, or Pd to make good electrical contact with an organic semiconductor layer. However, when the source and drain electrodes are formed of a noble metal, the absorption rate of a 248 nm UV laser beam is increased. Accordingly, when the organic semiconductor layer is patterned on an organic TFT using the laser beam, cracks are generated in the source and drain electrodes, as shown in FIG. 1.

SUMMARY OF THE INVENTION

Aspects of the present invention provide an organic thin film transistor that reduces damage to source and drain electrodes when patterning an organic semiconductor layer using a laser beam, by forming the source and drain electrodes in a double layer structure, and a flat display device having the same.

According to an aspect of the present invention, an organic thin film transistor comprises: a gate electrode; a source electrode and a drain electrode insulated from the gate electrode; an organic semiconductor layer insulated from the gate electrode and having a portion patterned to electrically connect to the source and drain electrodes; and a protection layer formed on the source and drain electrodes.

According to an aspect of the present invention, a flat display device comprises: an organic thin film transistor comprising: a gate electrode, a source electrode and a drain electrode insulated from the gate electrode, an organic semiconductor layer insulated from the gate electrode and having a portion patterned to electrically connect to the source and drain electrodes, and a protection layer formed on the source and drain electrodes; and a display device electrically connected to the organic thin film transistor.

According to another aspect of the present invention, a flat display device comprises: a gate electrode; a pixel electrode insulated from the gate electrode; a source electrode and a drain electrode insulated from the gate electrode and electrically connected to the pixel electrode; an organic semiconductor layer insulated from the gate electrode, exposing the pixel electrode, and patterned to be electrically connected to the source and drain electrodes; and a protection layer formed on the source and drain electrodes.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 2:
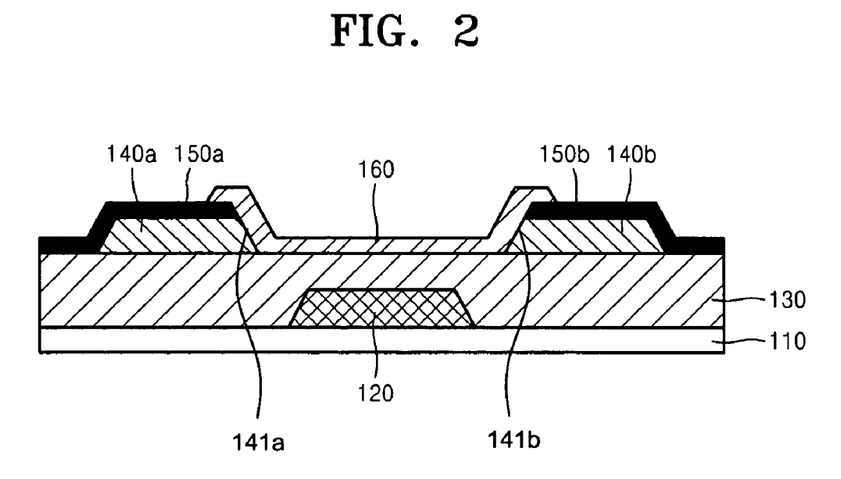
FIG. 2 is a cross-sectional view illustrating an organic thin film transistor according to an embodiment of the present invention.

FIG. 2 is a cross-sectional view illustrating an organic thin film transistor according to an embodiment of the present invention.

Referring to FIG. 2, a gate electrode 120 and source and drain wires (not shown) are formed on a substrate 110. The gate electrode 120 and the source and drain wires may be formed of a same material or of different materials.

The substrate 110 may be formed of a plastic material such as polyethylene terephthalate (PET), polyethylene naphthalate (PEN), polyether sulfone (PES), polyether imide, polyphenylene sulfide (PPS), polyallylate, polyimide, polycarbonate (PC), cellulose tri-acetate (TAC), cellulose acetate propinonate (CAP), etc., but is not limited thereto, and may also be formed of glass or a metal foil such as SUS or tungsten. The substrate 110 may be flexible.

The gate electrode 120 may be formed of a conductive metal such as MoW, Al, Cr, Al/Cr, or a conductive polymer such as conductive polyaniline, conductive poly pirrole, conductive polythiopjene, polyethylene dioxythiophene (PEDOT), polystyrene sulfone acid, etc., but must be selected in consideration of tight contact with the substrate 110, planarity of thin films formed on the gate electrode 120, workability for patterning, and resistance to chemicals used in subsequent processes.

After the gate electrode 120 is formed, a gate insulating layer 130 is formed. The gate insulating layer 130 is patterned to form an opening for electrical connection of an organic semiconductor layer to source and drain electrodes 140a and 140b and source and drain wires (not shown) which are formed in a subsequent process.

The gate insulating layer 130 may be an inorganic insulating layer formed of $SiO_2$, SiNx, $Al_2O_3$, $Ta_2O_5$, BST, or PZT using chemical vapor deposition or sputtering, or the gate insulating layer 130 may be a polymer organic insulating layer formed of a common polymer, for example, an imide polymer such as poly methylmethacrylate (PMMA), polystyrene (PS), phenol polymer, acryl polymer, or polyimide, an acrylether polymer, amide polymer, fluorine polymer, p-gilyrene polymer, vinylalcohol polymer, parylene, or a polymer compound that includes at least one of these materials. The gate insulating layer 130 may also be formed in various configurations, for example, a multiple layer that includes inorganic insulating layers and organic insulating layers.

After the gate insulating layer 130 is formed, the source and drain electrodes 140a and 140b are formed on a surface of the gate insulating layer 130. The source and drain electrodes 140a and 140b are formed of a noble metal such as Au, Pt, Pd, etc., to aid electrical contact with an organic semiconductor layer 160 which is formed in a subsequent process.

After the source and drain electrodes 140a and 140b are patterned, protection layers 150a and 150b for preventing a generation of cracks in the source and drain electrodes 140a and 140b by a laser beam are formed on the source and drain electrodes 140a and 140b. In this way, double layer structures of the source and drain electrodes 140a and 140b and the protective layers 150a and 150b, respectively, are formed. The protection layers 150a and 150b are formed on portions of the source and drain electrodes 140a and 140b except for portions 141a and 141b of the source and drain electrodes 140a and 140b that form a channel by contacting with the organic semiconductor layer 160.

The protection layers 150a and 150b may be formed in the same way that a photoresist pattern (not shown) is formed on the source and drain electrodes 140a and 140b where the channel is formed, and then, a material for forming the protection layers 150a and 150b is coated on the resultant product. Afterward, the photoresist pattern is removed by exposing and developing using a lift-off method. The protection layers 150a and 150b may also be formed by a photolithography process using a half tone mask, but the embodiment of the present invention is not limited thereto.

The protection layers 150a and 150b may be a transparent electrode formed of a transparent conductive material such as ITO, IZO, ZnO, or $In_2O_3$. The protection layers 150a and 150b prevent damage to the source and drain electrodes 140a and 140b while the organic semiconductor layer 160 is patterned using a laser beam, since the transparent conductive material has a low laser beam absorption rate. Also, through an ultraviolet ray processing, the work function of the protection layers 150a and 150b formed of a transparent conductive material is controllable to match the work function of the source and drain electrodes 140a and 140b formed of a noble metal such as Au, Pt, or Pd, to prevent electrical contact between the protection layers 150a and 150b and the organic semiconductor layer 160.

Since the transparent conductive material is transparent, ultraviolet rays pass therethrough when the organic semiconductor layer 160 is patterned. However, when the protection layers 150a and 150b are formed of an opaque conductive material such as oxi-Al, oxi-Mo, or oxi-MoW, the protection layers 150a and 150b do not absorb a laser beam. Accordingly, when the organic semiconductor layer 160 is patterned using a laser beam, damage to the source and drain electrodes 140a and 140b is prevented.

Where the protection layers 150a and 150b are formed of an oxi-metal, the protection layers may be formed by oxidizing a metal such as Al, Mo, or MoW using thermal oxidation, by which the surface of the metal is exposed in a furnace under an oxygen atmosphere and oxidized by annealing. The metal may also be oxidized using ozone washing, by which the metal area to be oxidized is ozone washed using plasma oxidation, and the surface of the metal is plasma processed, or using ultraviolet rays; however the metal oxidation method is not limited thereto. The oxidation process gives the protection layers 150a and 150b the same work function as the source and drain electrodes 140a and 140b. Accordingly, a problem of electrical contact between the protection layers 150a and 150b and the organic semiconductor layer 160 does not occur.

After the protection layers 150a and 150b are formed on the source and drain electrodes 140a and 140b, the organic semiconductor layer 160 is formed on the gate insulating layer 130, partly on the source and drain electrodes 140a and 140b, and partly on the protection layers 150a and 150b. The organic semiconductor layer 160 may be formed of pentacene, tetracene, anthracene, naphthalene, alpha-6-thiophene, alpha-4-thiophene, perylene and its derivatives, rubrene and its derivatives, coronene and its derivatives, perylene tetracarboxylic diimide and its derivatives, perylene tetracarboxylic dianhydride and its derivatives, oligoacen of naphthalene and its derivatives, alpha-5-thiophene oligothiophene and its derivatives, phthalocianin that includes or does not include a metal and its derivatives, naphthalene tetracarboxylic diimide and its derivatives, naphthalene tetracarboxylic dianhydride and its derivatives, phyromeliticdianhydride and its derivatives, phyromelitic diimid and its derivatives, conjugated polymers that include thiopene and its derivatives, or polymers that include fluorene and its derivatives.

When the organic semiconductor layer 160 is formed, electrical signals are communicable with the source and drain electrodes 140a and 140b through a channel. In this case, cross-talk may occur between adjacent organic thin film transistors. To prevent cross-talk, the organic thin film transistors are separated from each other by patterning the organic semiconductor layer 160.

The patterning of the organic semiconductor layer 160 may be performed using various methods, including, for example laser ablation, by which a portion of the organic semiconductor layer 160 is removed by a laser beam. Since the protection layers 150a and 150b are formed on the source and drain electrodes 140a and 140b, the source and drain electrodes 140a and 140b are not damaged when the organic semiconductor layer 160 is patterned using the laser beam.

Figure 3:
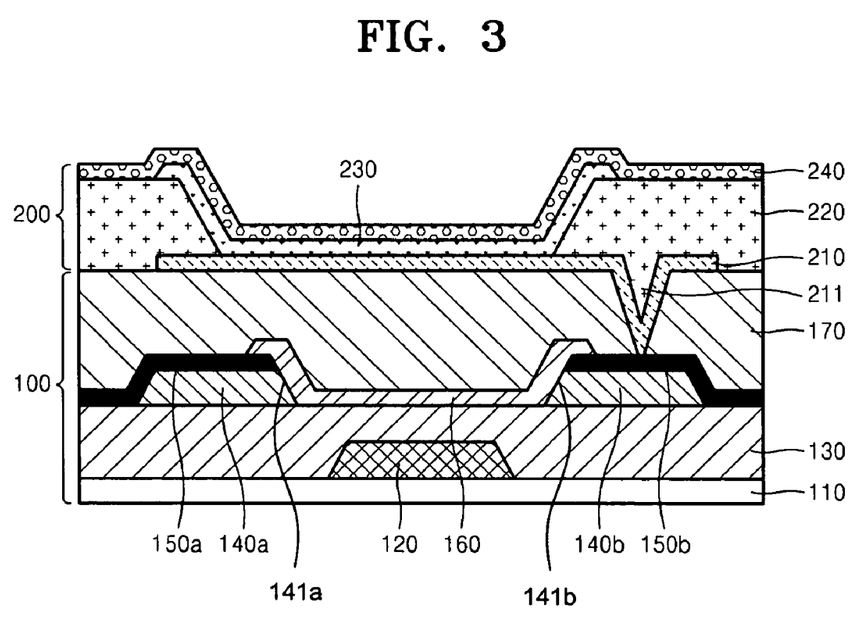
FIG. 3 is a cross-sectional view illustrating a flat display device having the organic thin film transistor shown in FIG. 2.

FIG. 3 is a cross-sectional view illustrating an example of a flat display device having the organic thin film transistor shown in FIG. 2. The flat panel display device, such as an organic light emitting display (OLED) device shown in FIG. 3 comprises an organic thin film transistor unit 100 and a pixel unit 200.

The organic thin film transistor unit 100 includes a substrate 110, a gate electrode 120, a gate insulating layer 130 formed on the gate electrode 120, source and drain electrodes 140a and 140b formed on the gate insulating layer 130, protection layers 150a and 150b formed on the source and drain electrodes 140a and 140b, except for portions 141a and 141b corresponding to a channel, using a transparent conductive material or a metal oxide, an organic semiconductor layer 160 patterned by a laser beam, and a protection layer 170.

The pixel unit 200 includes a first electrode layer 210, a pixel defining layer 220, an organic light emitting unit 230, and a second electrode layer 240.

The organic thin film transistor unit 100, except for the protection layer 170, is shown in FIG. 2 and described above, and thus a detailed description thereof will not be repeated, for the sake of brevity.

After the protection layers 150a and 150b are formed and the organic semiconductor layer 160 is patterned, the protection layer 170, i.e., a passivation layer and/or a planarizing layer, for insulating and/or planarizing the organic thin film transistor unit 100, is formed.

The first electrode layer 210 for a pixel electrode is formed on the protection layer 170. The first electrode layer 210 is electrically connected to the organic thin film transistor unit 100 through a via hole 211 formed in the protection layer 170.

The first electrode layer 210 may be formed in various ways. For example, the first electrode layer 210 may be a transparent electrode formed of a transparent conductive material, such as, ITO, IZO, ZnO, or $In_2O_3$. Alternatively, if the organic light emitting device is a top emission type, the first electrode layer 210 may be formed to have a structure in which a reflection electrode that includes Ag, Mg, Al, Pt, Pd, Au, Ni, Nd, Ir, Cr, or a compound of these metals and a transparent electrode are formed thereon. The first electrode layer 210 is not limited to a single layer or a double layer, but may be modified to various forms, such as multiple layers.

After the first electrode layer 210 is formed, the pixel defining layer 220 for defining a pixel opening is formed on the first electrode layer 210. After the pixel defining layer 220 is formed, the organic light emitting unit 230 is formed in at least a region that includes the pixel opening.

The organic light emitting unit 230 may be formed of a low molecular weight organic film or a polymer organic film. If the organic light emitting unit 230 is formed using the low molecular weight organic film, a Hole Injection Layer (HIL), a Hole Transport Layer (HTL), an Emission Layer (EML), an Electron Transport Layer (ETL), an Electron Injection Layer (EIL) may be stacked in a single structure or a composite structure, and organic materials may be used including copper phthalocyanine (CuPc), N,N'-Di(naphthalene-1-yl)-N, N'-diphenyl-benzidine (NPB), tris-8-hydroxyquinoline aluminum (Alq3), etc. The low molecular weight organic film may be formed by an evaporation method.

Where the organic light emitting unit 230 is formed using a polymer organic film, the organic light emitting unit 230 may have a structure that includes an HTL and an EML, and the HTL may be formed of PEDOT and the EML may be formed of Poly-Phenylenevinylene (PPV) and Polyfluorene. The polymer organic film may be formed by various methods including screen printing or ink jet printing. The organic films forming the organic light emitting unit 230 are not limited to the films set forth above, but may include various embodiments.

The second electrode layer 240 for a facing electrode may be formed in various configurations according to a polarity of electrodes and a type of light emission. If the second electrode layer 240 serves as a cathode electrode and the organic light emitting display (OLED) device is a bottom emission type, the second electrode layer 240 may be composed of more than one layer using a material having a low work function such as Li, Ca, LiF/Ca, LiF/Al, Al, Ag, Mg, or a compound of these metals, or if the organic light emitting display (OLED) device is a top emission type, after forming an electrode to match the work function of the organic light emitting unit 230 on the surface of the organic light emitting unit 230 using a material such as Li, Ca, LiF/Ca, LiF/Al, Al, Ag, Mg, or a compound of these metals, a transparent electrode may be formed on the electrode using ITO, IZO, ZnO, or $In_2O_3$. In the embodiment shown in FIG. 3, the first electrode layer 210 serves as an anode electrode and the second electrode layer 240 serves as a cathode electrode, but the embodiment shown is not limited thereto, and the polarity of the first and second electrode layers 230 and 240 may be reversed.

Figure 4:
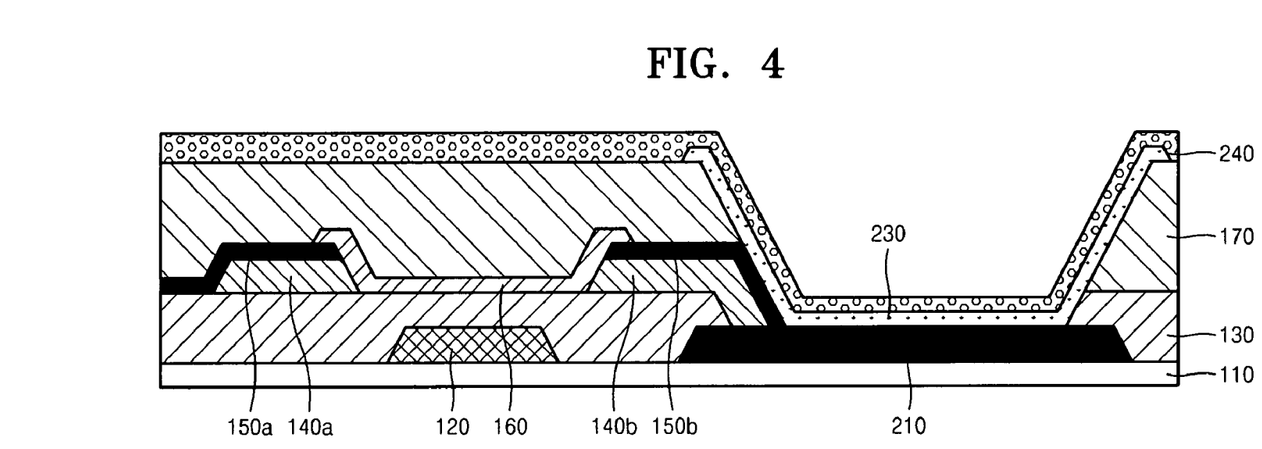
FIG. 4 is a cross-sectional view illustrating another flat display device having the organic thin film transistor shown in FIG. 2.

FIG. 4 is a cross-sectional view illustrating another embodiment of a flat display device having the organic thin film transistor shown in FIG. 2. In the embodiment shown in FIG. 4, a gate electrode 120 and a first electrode layer 210 for a pixel electrode are formed at the same time. The flat display device shown in FIG. 4 is a bottom emission type, and the first electrode layer 210 and protection layers 150a and 150b may be formed of a same transparent conductive material, such as ITO, IZO, ZnO, or $In_2O_3$.

Agate insulating layer 130 formed on the gate electrode 120 is patterned until a portion of the first electrode layer 210 is exposed. Source and drain electrodes 140a and 140b and the protection layers 150a and 150b formed on the surface of the gate insulating layer 130 are formed to be electrically connected to the first electrode layer 210. After the gate insulating layer 130 is formed on the source and drain electrodes 140a and 140b on which the protection layers 150a and 150b are formed, a portion of the source and drain electrodes 140a and 140b and a portion of the gate insulating layer 130 are patterned by laser ablation. The first electrode layer 210 is not damaged by a laser since the first electrode layer 210 is formed of the same material as the protection layers 150a and 150b which protect the source and drain electrodes 140a and 140b.

After the organic semiconductor layer 160 is patterned, the protection layer 170, i.e., a passivation layer and/or a planarizing layer, for insulating and/or planarizing the organic thin film transistor unit 100, is formed. The protection layer 170 is patterned until a portion of the first electrode layer 210 is exposed.

An organic light emitting unit 230 is formed on the first electrode layer 210, and a second electrode layer 240 for a facing electrode is formed on the organic light emitting unit 230. The description thereof will not be repeated since these elements have been described with reference to FIGS. 2 and 3.

Figure 5:
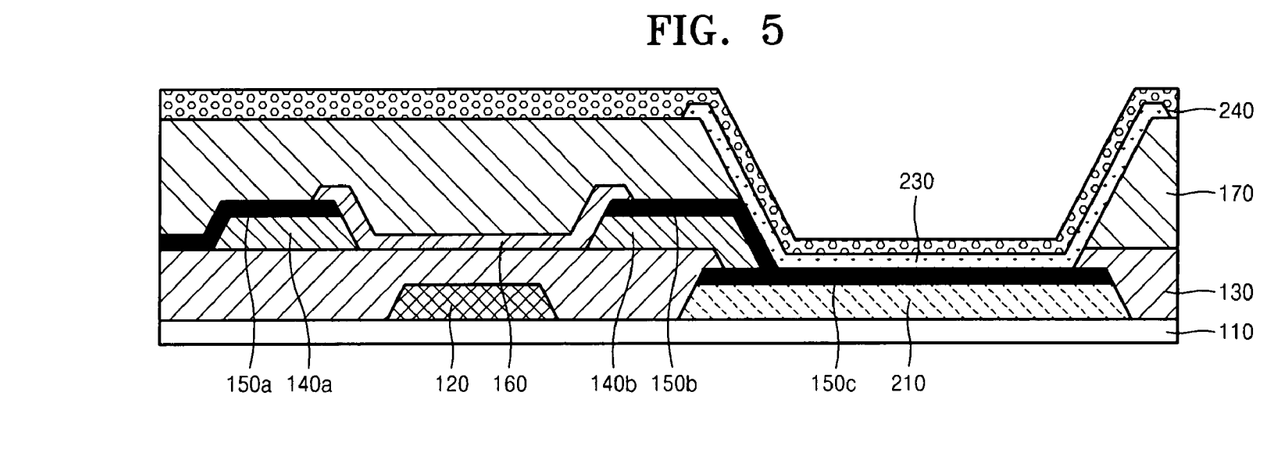
FIG. 5 is a cross-sectional view illustrating another flat display device having the organic thin film transistor shown in FIG. 2.

FIG. 5 is a cross-sectional view illustrating another embodiment of a flat display device having the organic thin film transistor shown in FIG. 2. In the embodiment shown in FIG. 5, a first electrode layer 210 is not formed of the same material as protection layers 150a and 150b as in the embodiment shown in FIG. 4, but the first electrode layer 210 is formed of Ag, Mg, Al, Pt, Pd, Au, Ni, Nd, Ir, Cr, or a compound of these metals. In this case, when the first electrode layer 210 is patterned by laser ablation, the first electrode layer 210 can be damaged. Therefore, a protection layer 150c is formed on the first electrode layer 210. That is, the first electrode layer 210 has a double layer structure having the protection layer 150c. Accordingly, the first electrode layer 210 is not damaged by the laser beam. The remaining elements shown in FIG. 5 are the same as the corresponding elements shown in FIG. 4, thus a description thereof will not be repeated.

Figure 6:
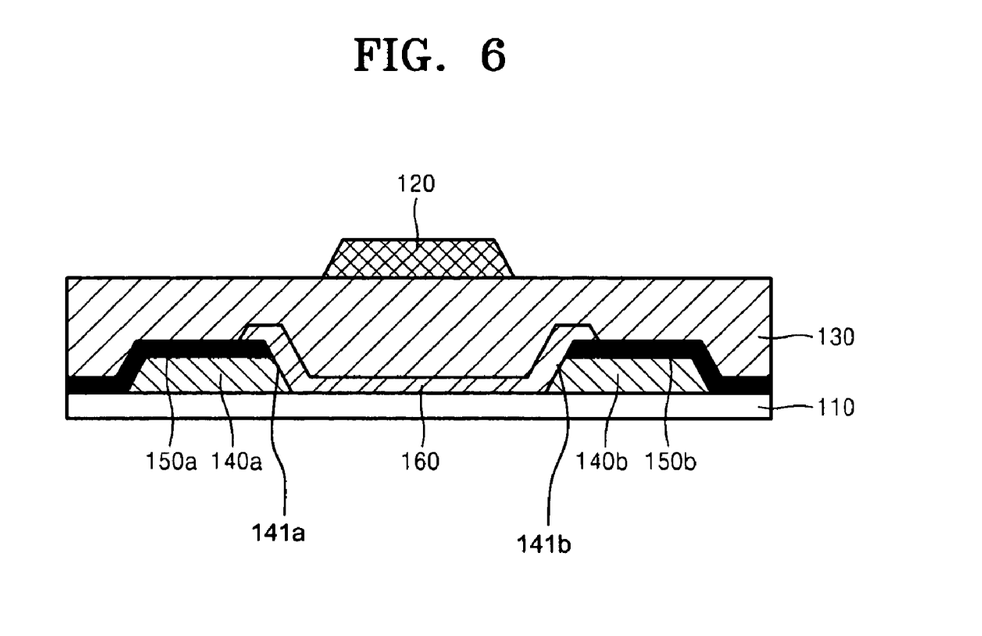
FIG. 6 is a cross-sectional view illustrating an organic thin film transistor according to another embodiment of the present invention.

FIG. 6 is a cross-sectional view illustrating an organic thin film transistor according to another embodiment of the present invention. Referring to FIG. 6, source and drain electrodes 140a and 140b are formed on the surface of a substrate 110. To aid contact with an organic semiconductor layer 160 which will be formed in a subsequent process, the source and drain electrodes 140a and 140b are formed in a pattern using a noble metal such as Au, Pt, Pd, etc.

After the source and drain electrodes 140a and 140b are patterned, protection layers 150a and 150b for preventing cracks by a laser beam are formed. In this way, the source and drain electrodes 140a and 140b have a double layer structure. The protection layers 150a and 150b are formed on the source and drain electrodes 140a and 140b except for a region corresponding to a channel.

To form the protection layers 150a and 150b, a photoresist pattern (not shown) is formed on the source and drain electrodes 140a and 140b where the channel is formed, and then a material for forming the protection layers 150a and 150b is coated on the resultant product. Afterward, the photoresist pattern is removed by exposing and developing using a lift-off method. The protection layers 150a and 150b may also be formed by a photolithography process using a halftone mask, but the embodiment shown is not limited thereto.

The protection layers 150a and 150b may be a transparent electrode formed of transparent conductive material such as ITO, IZO, ZnO, or $In_2O_3$. When the protection layers 150a and 150b are formed of a transparent conductive material, damage to the source and drain electrodes 140a and 140b is prevented while the organic semiconductor layer 160 is patterned by a laser beam, since the transparent conductive material has a low laser absorption rate. Also, through ultraviolet ray processing, the work function of the protection layers 150a and 150b formed of a transparent conductive material may be controlled to match the work function of the source and drain electrodes 140a and 140b formed of a noble metal such as Au, Pt, or Pd, to prevent electrical contact between the protection layers 150a and 150b and the organic semiconductor layer 160.

Also, since the transparent conductive material is transparent, ultraviolet rays pass therethrough when the organic semiconductor layer 160 is patterned. However, when the protection layers 150a and 150b are formed of an opaque conductive material such as oxi-Al, oxi-Mo, or oxi-MoW, the protection layers 150a and 150b do not absorb a laser beam. Accordingly, when the organic semiconductor layer 160 is patterned using a laser beam, damage to the source and drain electrodes 140a and 140b is prevented.

The oxi-metal protection layers 150a and 150b may be formed by oxidizing a metal such as Al, Mo, MoW using thermal oxidation, by which the surface of the metal is exposed in a furnace under an oxygen atmosphere and oxidized by annealing. The metal can also be oxidized using ozone washing, by which the metal area to be oxidized is ozone washed, using plasma oxidation, by which the surface of the metal is plasma processed, or using ultraviolet rays, but the metal oxidation method is not limited thereto. The oxidation process gives the protection layers 150a and 150b the same work function as the source and drain electrodes 140a and 140b. Accordingly, the problem of electrical contact between the protection layers 150a and 150b and the organic semiconductor layer 160 does not occur.

After the protection layers 150a and 150b are formed on the source and drain electrodes 140a and 140b, the organic semiconductor layer 160 is formed.

When the organic semiconductor layer 160 is formed, electrical signals are communicable with the source and drain electrodes 140a and 140b through a channel. In this case, cross-talk may occur between adjacent organic thin film transistors. To prevent cross-talk, the organic thin film transistors are separated from each other by patterning the organic semiconductor layer 160.

The patterning of the organic semiconductor layer 160 may be performed using various methods, for example laser ablation, by which a portion of the organic semiconductor layer 160 is removed by a laser beam. Since the protection layers 150a and 150b are formed on the source and drain electrodes 140a and 140b, the source and drain electrodes 140a and 140b are not damaged when the organic semiconductor layer 160 is patterned using the laser beam.

After the organic semiconductor layer 160 is formed, a gate insulating layer 130 is formed on the protection layers 150a and 150b and the organic semiconductor layer 160, and a gate electrode 120 is formed on the gate insulating layer 130.

Figure 7:
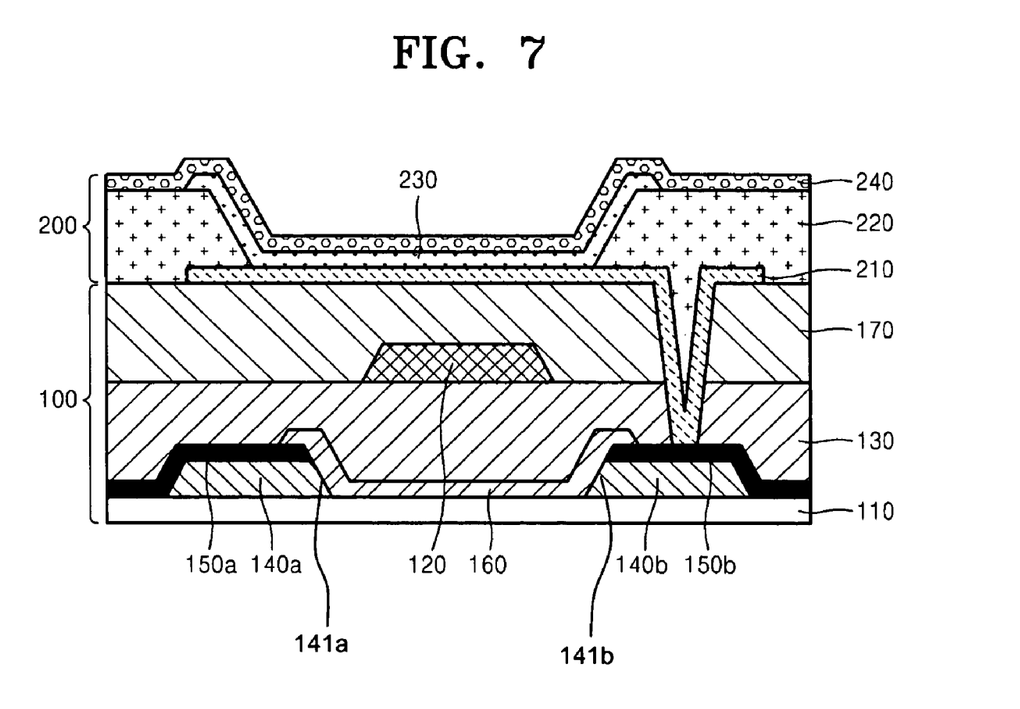
FIG. 7 is a cross-sectional view illustrating a flat display device having the organic thin film transistor shown in FIG. 6.

FIG. 7 is a cross-sectional view illustrating a flat display device having the organic thin film transistor shown in FIG. 6. The flat display device includes an organic thin film transistor unit 100 and a pixel unit 200. The organic thin film transistor unit 100 is identical to the organic thin film transistor shown in FIG. 6, and the pixel unit 200 is identical to the pixel unit shown in FIG. 3, and thus a description thereof will not be repeated.

Figure 8:
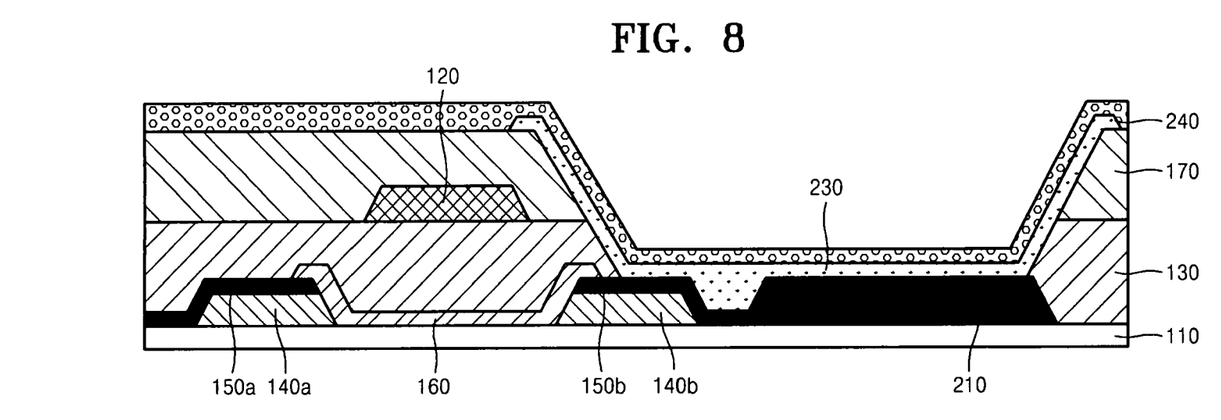
FIG. 8 is a cross-sectional view illustrating another flat display device having the organic thin film transistor shown in FIG. 6.

FIG. 8 is a cross-sectional view illustrating another flat display device having the organic thin film transistor shown in FIG. 6. Unlike the organic thin film transistor shown in FIG. 7, source and drain electrodes 140a and 140b and a first electrode layer 210 for a pixel electrode are formed on the substrate 110, and the source and drain electrodes 140a and 140b and the first electrode layer 210 are electrically connected prior to patterning the source and drain electrodes 140a and 140b. After patterning of the source and drain electrodes, one of the source and drain electrodes 140a and 140b remains electrically connected to the first electrode layer 210.

The flat display device shown in FIG. 8 is a bottom emission type. The first electrode layer 210 and protection layers 150a and 150b may be formed of the same transparent conductive material such as ITO, IZO, ZnO, or $In_2O_3$.

The protection layers 150a and 150b are formed on the source and drain electrodes 140a and 140b, an organic semiconductor layer 160 is formed on the source and drain electrodes 140a and 140b on which the protection layers 150a and 150b are formed, and the organic semiconductor layer 160 is patterned to expose a portion of the source and drain electrodes 140a and 140b and a portion of the first electrode layer 210, by laser ablation. Afterward, a gate insulating layer 130 is formed on the protection layers 150a and 150b and the organic semiconductor layer 160, and patterned to expose a portion of the first electrode layer 210. A gate electrode 120 is formed on the gate insulating layer 130.

After the gate electrode 120 is formed, a protection layer 170, i.e., a passivation layer and/or a planarizing layer, for insulating and/or planarizing the organic thin film transistor unit 100, is formed. The protection layer 170 is patterned to expose a portion of the first electrode layer 210.

An organic light emitting unit 230 is formed on the first electrode layer 210, and a second electrode layer 240 for a facing electrode is formed on the organic light emitting unit 230. The organic light emitting unit 230 and the second electrode layer 240 are the same as those described with reference to FIGS. 6 and 7, so their description will not be repeated.

Figure 9:
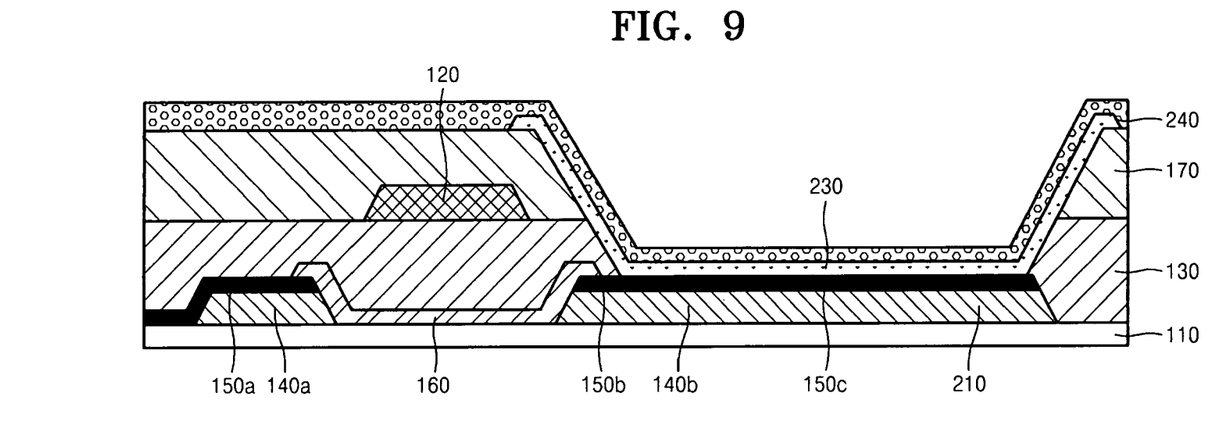
FIG. 9 is a cross-sectional view illustrating another flat display device having the organic thin film transistor shown in FIG. 6.

FIG. 9 is a cross-sectional view illustrating still another flat display device having the organic thin film transistor shown in FIG. 6. The organic thin film transistor shown in FIG. 9 differs from the organic thin film transistor shown in FIG. 8 in the following respects. The first electrode layer 210 is not formed of the same material as the protection layers 150a and 150b, but is formed of Ag, Mg, Al, Pt, Pd, Au, Ni, Nd, Ir, Cr, or a compound of these metals. In this case, when the first electrode layer 210 is patterned by laser ablation, the first electrode layer 210 may be damaged like the source and drain electrodes 140a and 140b. Therefore, a protection layer 150c is formed on the first electrode layer 210. That is, the first electrode layer 210 has a double layer structure having the protection layer 150c. Accordingly, the first electrode layer 210 is not damaged by the laser beam. The remaining elements shown in FIG. 9 are identical to the corresponding elements shown in FIG. 8, thus the description thereof will not be repeated.

The embodiments of the present invention described above are examples, and thus do not limit the present invention. The thin film transistor according to the present invention may also be applied to liquid crystal display devices as well as organic light emitting display devices, and may also be applied to driver circuits that do not display images.

According to the present invention, source and drain electrodes are formed in a double layer structure of a metal and a transparent conductive material or a metal and a metal oxide, to prevent damage to the source and drain electrodes when an organic semiconductor layer is patterned by laser ablation.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A flat display device comprising:
an organic thin film transistor comprising:
a gate electrode,
a source electrode and a drain electrode insulated from the gate electrode,
protection layer formed directly on both the source and drain electrodes and comprising at least one material selected from the group consisting of oxidized Al, oxidized Mo and oxidized MoW, and
an organic semiconductor layer insulated from the gate electrode and having a portion patterned to electrically connect to the source and drain electrodes, the organic semiconductor layer being disposed directly on the protection layer; and
a display device electrically connected to the organic thin film transistor, wherein
the source and drain electrodes comprise at least one metal selected from the group consisting of Au, Pt and Pd, and
the work function of the protection layer is equal to the work function of the source and drain electrodes, due to the oxidation of the protection layer.

2. The flat display device of claim 1, wherein the organic semiconductor layer is patterned by a laser beam.

3. A flat display device comprising:
a gate electrode;
a pixel electrode insulated from the gate electrode;
a source electrode and a drain electrode insulated from the gate electrode, one of the source electrode and drain electrode being electrically connected to the pixel electrode;
an organic semiconductor layer insulated from the gate electrode, exposing the pixel electrode, and patterned to be electrically connected to the source and drain electrodes; and
a protection layer formed directly on the source and drain electrode and comprising an oxide film selected from the group consisting of oxidized Al, oxidized Mo and oxidized MoW, wherein,
the organic semiconductor layer is disposed directly on the protection layer,
the source and drain electrodes comprise at least one metal selected from the group consisting of Au, Pt and Pd, and
the work function of the protection layer is equal to the work function of the source and drain electrodes, due to the oxidation of the protection layer.

4. The flat display device of claim 3, wherein the organic semiconductor layer is patterned by a laser beam.

5. The flat display device of claim 3, wherein the pixel electrode and the protection layer are formed in one unit.

6. The flat display device of claim 3, wherein the pixel electrode is formed of at least one metal selected from the group consisting of Ag, Mg, Al, Pt, Pd, Au, Ni, Nd, Ir, Cr, and compounds thereof.

7. The flat display device of claim 6, wherein the protection layer is formed on the pixel electrode.

8. The flat panel display device of claim 3, wherein the protection layer and the pixel electrode are formed of the same material.

9. The flat panel display device of claim 3, wherein the protection layer is formed directly on the pixel electrode.

* * * * *